US006373258B2

(12) United States Patent
Takada

(10) Patent No.: US 6,373,258 B2
(45) Date of Patent: Apr. 16, 2002

(54) NON-CONTACT BOARD INSPECTION PROBE

(76) Inventor: Naoya Takada, c/o Okano Hightech Co., Ltd., 1118-1, Aza-nishichujo, Kannabe-cho, Fukayasu-gun, Hiroshima-ken (JP)

( * ) Notice: Subject to any disclaimer, the term of this patent is extended or adjusted under 35 U.S.C. 154(b) by 0 days.

(21) Appl. No.: 09/765,290

(22) Filed: Jan. 22, 2001

Related U.S. Application Data

(62) Division of application No. 08/795,859, filed on Feb. 6, 1997, now Pat. No. 6,201,398.

(30) Foreign Application Priority Data

Mar. 28, 1996 (JP) .............................................. 8-104148

(51) Int. Cl.[7] .......................... H01H 31/02; G01R 23/04
(52) U.S. Cl. .......................................... 324/537; 324/95
(58) Field of Search ............................ 324/66, 67, 523, 324/527–530; 327/537, 95, 538, 690

(56) References Cited

U.S. PATENT DOCUMENTS

| 3,975,680 A | 8/1976 | Webb .......................... 324/686 |
| 4,439,727 A | 3/1984 | Boyle .......................... 324/763 |
| 4,565,966 A | 1/1986 | Burr et al. ................... 324/519 |
| 4,583,042 A | 4/1986 | Riemer ......................... 324/519 |
| 5,055,776 A | 10/1991 | Miller et al. ................. 324/537 |
| 5,072,176 A | 12/1991 | Miller et al. ................. 324/537 |
| 5,079,501 A | 1/1992 | Miller et al. ................. 324/537 |
| 5,124,647 A | 6/1992 | Watts ........................... 324/757 |
| 5,124,660 A | 6/1992 | Cilingiroglu ................. 324/538 |
| 5,166,626 A | 11/1992 | Hester .......................... 324/690 |
| 5,254,953 A | 10/1993 | Crook et al. ................. 324/538 |
| 5,266,901 A | 11/1993 | Woo ............................. 324/537 |
| 5,274,336 A | 12/1993 | Crook et al. ................. 324/690 |
| 5,391,993 A | 2/1995 | Khazam et al. .............. 324/684 |
| 5,420,500 A | 5/1995 | Kerschner ................... 324/72.5 |
| 5,444,364 A * | 8/1995 | Satterwhite et al. ........... 324/67 |
| 5,517,110 A | 5/1996 | Soiferman ................... 324/158.1 |
| 5,608,328 A * | 3/1997 | Sanderson ................... 324/529 |
| 5,696,451 A | 12/1997 | Keirn et al. ................. 324/687 |
| 5,747,999 A | 5/1998 | Yamaoka ..................... 324/501 |
| 6,087,842 A * | 7/2000 | Parker et al. ................ 324/763 |
| 6,184,672 B1 * | 2/2001 | Berkcan ................... 324/117 R |

FOREIGN PATENT DOCUMENTS

| EP | 0 177 210 | 4/1986 |
| GB | 2143954 A | 7/1983 |
| JP | 50-31362 | 3/1975 |

(List continued on next page.)

OTHER PUBLICATIONS

Nihon Keizai Shinbun newspaper article, published Feb. 7, 1996, discussing Okano "Surface probe" (partial translation included).
Noise Technique in Electronic Circuit, Technical Book, published in 1987. (Month unavailable).
Electro–Magnetic Interference, Technical Book, published in 1991. (Month unavailable).

(List continued on next page.)

Primary Examiner—Ernest Karlsen
Assistant Examiner—Russell M. Kobert
(74) Attorney, Agent, or Firm—Armstrong, Westerman & Hattori, LLP

(57) ABSTRACT

A board inspection probe for inspecting pattern lines on a circuit board for defects in a non-contact manner. The probe has an electrode for radiating an electrical signal or receiving an electrical signal radiated from a first pattern line. The probe also has a shield to prevent, from reaching the electrode, unwanted radiant waves emitted from pattern lines located in a region except a board region immediately below an electrode surface of the electrode. This shield is terminates near the electrode surface of the electrode, so that radiant waves from only pattern lines located on the board region immediately below the electrode are received.

7 Claims, 7 Drawing Sheets

FOREIGN PATENT DOCUMENTS

| | | |
|---|---|---|
| JP | 55-72872 | 6/1980 |
| JP | 58-38874 | 3/1983 |
| JP | 58-146866 | 9/1983 |
| JP | 59-168375 | 9/1984 |
| JP | 61-62877 | 3/1986 |
| JP | 62-257070 | 11/1987 |
| JP | 63-58270 | 3/1988 |
| JP | 1-199173 | 8/1989 |
| JP | 3-154879 | 7/1991 |
| JP | 4-25775 | 1/1992 |
| JP | 4-236365 | 8/1992 |
| JP | 4-244976 | 9/1992 |
| JP | 4-309875 | 11/1992 |
| JP | 5-264672 | 10/1993 |
| JP | 6-34714 | 2/1994 |
| JP | 6-58974 | 3/1994 |
| JP | 6-213955 | 3/1994 |
| JP | 6-160456 | 6/1994 |
| JP | 6-160457 | 6/1994 |
| JP | 7-146323 | 6/1995 |
| JP | 7-287042 | 10/1995 |
| JP | 8-226949 | 9/1996 |
| JP | 8-278342 | 10/1996 |
| WO | WO90/04792 | 5/1990 |
| WO | WO 90/14604 | 11/1990 |

OTHER PUBLICATIONS

Earth and Measures for Noise, Technical Book, published in 1987. (Month unavailable).

Nikkei Electronics, Sep. 5, 1994, No. 616.

Electronic Packaging Technology, vol. 11, No. 12. (No Date available).

Dictionary of Scientific and Technical Terms, McGraw–Hill, pp. 1419, 578, and 1498, published in 1996. (Month unavailable).

Encyclopedia, Heibonsha, p. 653, published on 1984. (Month unavailable).

Motor Control, Technical Book, pp. 30–31, published in 1981. (Month unavailable).

Electrical Engineering Pocketbook, Technical Book, pp. 158–161 and 226–227, published in 1990. (Month unavailable).

EMI and Measures Therefor, Technical book, pp. 30–31, published in 1990. (No month).

Dictionary of Scientific and Technical Terms, McGraw–Hill, pp. 983 and 1230, 1996. (No month).

Electrical Engineering Pocketbook, Technical Book, pp. 338–339, published in 1990. (No month).

EMC and Basic Techniques, Technical Book, pp. 34–35 and 62–65, published in 1990. (No month).

Introduction to Sensors, Technical Book, pp. 72–77, published in 1993. (No month).

Microwave Circuits for Communication, Technical Book, pp. 62–63, published in 1989. (No month).

* cited by examiner

NON-CONTACT BOARD INSPECTION PROBE

This application is a divisional, of Application No. 08/795,859, filed Feb. 6, 1997 now Pat. No. 6,201,398

BACKGROUND OF THE INVENTION

The present invention relates to an inspection probe used for inspecting a board in a non-contact manner, and an inspection method and apparatus using this probe. A target board is represented by a board printed with conductive patterns at a small pitch and includes e.g., a flexible board (a "flexible board" includes an LSI package which is not mounted with IC chip and is to be mounted therewith, and will be referred to simply as a "circuit board" hereinafter). More particularly, the present invention relates to a non-contact board inspection probe and an inspection method and apparatus, all of which are suitable for inspecting local patterns on a board for disconnections and the like.

The board inspection probe and the inspection method and apparatus of the present invention are effective in inspecting a so-called bare circuit board on which no circuit elements such as IC packages are mounted yet although conductive patterns having a small pitch are printed thereon.

In conventional board inspection, if a board on which conductive patterns having a small pitch are printed has a large pitch on the electrode side, as shown in FIG. 1, probes can be brought into contact with the electrode groups (two or more electrode groups) of the board to energize the board (power is supplied from one electrode group, and the inspection result is detected on the other electrode group).

A recent highly-integrated circuit board, however, has small pitches in not only conductive patterns, but also electrodes. This makes it difficult to accurately bring probes into contact with the electrodes having a small pitch. An inspection for determining defectiveness/nondefectiveness (particularly, the presence/absence of a disconnection) of such a board having patterns (conductive paths) with a small pitch has often relied on visual observation or the like.

In recent years, the conductive patterns of a board (inspection target board) have a higher density (smaller pitch) along with decreases in size and weight of electronic devices. The decrease in pitch tends to cause disconnections in conductive patterns. A strong demand has therefore arisen for board inspection meeting this tendency. Demands for improving workability and reliability and decreasing the cost have become important.

In inspection for a board having patterns with a small pitch, in addition to a problem posed by the difficulty in accurate positioning of probes on electrodes, another problem is posed by an increase in the number of measuring points. More specifically, in such a board, when the wiring density of conductive patterns increases (i.e., when the pitch becomes small), the number of input and output points (the number of measuring points) increases. Even if contact probing is possible, it is technically difficult to maintain stable contact precision and contact properties. In addition, as the test conditions are becoming stricter than before, complicated, high-precision inspection jigs must be prepared, resulting in high cost.

Under these circumstances, several prior-art techniques based on non-contact probing, i.e., the board inspection free from the problem posed by contact between probes and electrodes are known.

For example, British Patent No. GB2143954A has proposed a technique for positioning a probe electrode at the end of a conductive path to form capacitive coupling between the electrode and the end of the conductive path. An AC signal is applied between the electrode and the one end of the conductive path, and a signal is detected at the other end of the conductive path through the above capacitive coupling. By this technique, a board can be inspected without bringing the probe into contact with the conductive pattern.

Japanese Patent Laid-Open No. 6-34714 (U.S. Pat. No. 5,254,953) is deemed an improved proposal of the non-contact inspection method disclosed in GB2143954A described above.

Japanese Patent Laid-Open No. 5-264672 (U.S. Pat. No. 5,274,336) discloses a capacitive coupling probe (probe chip) used in an in-circuit test for a high-density circuit board.

In the above prior arts, the "non-contact" means coupling free from ohmic contact and is equivalently used as the "capacitive". That is, a means for capacitive coupling is a capacitor.

The present inventor found that when the above prior-art inspection method and apparatus, however, were applied to a circuit board such as a bare board prior to mounting circuit parts thereon, it was difficult to highly accurately detect the presence/absence of a defect (e.g., a disconnection). That is, even if the prior-art technique is used to inspect a board in which the presence of a disconnection has been confirmed, an inspection result representing the absence of a disconnection is obtained. The present inventor found the cause for this as follows.

FIG. 2 is a block diagram of an inspection apparatus in U.S. Pat. No. 5,254,953. This prior-art technique is an apparatus serving as an in-circuit tester. This tester inspects to find whether a lead wire 111 of an IC package 110 is normally connected to a lead wire 140 on a circuit board by soldering 200. That is, the tester inspects soldered portions, but does not inspect the pattern itself for any defects.

Referring to FIG. 2, an AC signal is supplied from an oscillator 100 to the lead wire 140 between a probe electrode 120 and the lead wire 111 through a capacitor layer formed by air layer and the IC package 110. A shield 130 is arranged to prevent the probe electrode 120 from picking up EMI (Electro-Magnetic Interference) from various devices (not shown) located above the probe electrode 120.

If soldering 200 is proper, the AC signal is detected by an electrode 310 and measured by an inspection apparatus 300. Whether soldering is defective or nondefective is determined by the magnitude of the signal detected by the electrode 310. Note that the capacitance of the capacitor layer formed by the air layer and the IC package 110 between the probe electrode 120 and the lead wire 111 is as small as several femtofarad (fF), and the amplitude of the signal detected by the electrode 310 is very small.

The present inventor found that when this probe electrode 120 was applied to a bare board 500, as shown in FIG. 3, the measurement of a signal by the electrode 310 upon intentionally forming a disconnection 510 in a lead wire 520 on the board 500 had almost no difference in the amplitude of the detection signal from the measurement of a signal by the electrode 310 through a lead wire 520 free from disconnections.

According to the findings of the present inventor, no difference was found in detection signal between the cases in which the disconnection 510 was present and it was absent because the signal applied to the probe electrode 120 propagated in the electro-magnetic field formed in the air layer and was received by a lead wire portion 520*a*, and the signal on the lead wire portion 520*a* was detected by the electrode 310.

Although the inspection apparatus in FIG. 3 has the shield 130 which is effective to protect the probe electrode 120 from the EMI signal coming from above, the inspection apparatus is defenseless against radiant waves from various radiant sources located below the electrode 120.

In inspecting a bare board, as shown in FIG. 3, the probe electrode must particularly come closer to the bare board. In the inspection apparatus disclosed in U.S. Pat. No. 5,254,953 to inspect an in-circuit board which need not bring a probe electrode closer to the board due to the presence of parts, the problem posed by the EMI signal from the board does not arise because the probe electrode is used far away from the board.

SUMMARY OF THE INVENTION

It is an object of the present invention to provide a board detection probe and a board inspection method and apparatus, wherein a shield for preventing an EMI signal from acting on a pattern on a board or from being emitted from the pattern in the board inspection apparatus for inspecting the board by causing a probe to come close to the board, thereby realizing highly accurate inspection.

In order to achieve the above object, a board inspection probe (600, 700) for inspecting a pattern line on a circuit board for a defect in a non-contact manner comprises:

a main body;

an electrode (620) formed at a position near a board side of the main body and having a conductive electrode surface (620*h*) for radiating an electrical signal toward a first pattern line (520) or receiving an electrical signal radiated from the first pattern line; and a shield (610) which is at least electrically grounded, wherein the shield (610) has a blank surface which does not shield a radiant wave to a second pattern line (520*a*) or a radiant wave from the second pattern line (520*a*) in a first region of the board which substantially corresponds to the electrode surface of the electrode, and a shield surface (610*a*, 610*b*, or 650) having an end portion extending near an end portion of the electrode surface without being in electrical contact with the end portion of the electrode surface in order to mainly shield a radiant wave to a third pattern line (520*b*) or a radiant wave from the third pattern line (520*b*) in a second region except the first region on the board.

It is another object of the present invention to provide an inspection method and apparatus using the probe having the above arrangement.

It is still another object of the present invention to provide a probe in which the shield surface (610*a*, 610*b*) of the shield horizontally and vertically extends to partially cover a vertical surface of the electrode.

It is still another object of the present invention to provide a probe in which the shield surface (610*a*, 610*b*) vertically and horizontally extends to entirely cover the vertical surface of the electrode.

According to an aspect of the present invention, pattern lines having a pitch of several decade $\mu$m are formed on the board as a target board of a probe of the present invention.

According to another aspect of the present invention, the board as a target board of the probe of the present invention is a bare board prior to mounting circuit parts thereon, and the electrode surface has an area substantially equal to that of the circuit parts in the horizontal direction.

According to still another aspect of the present invention, the electrode surface of the probe has a size of several $cm^2$ to several $mm^2$.

According to still another aspect of the present invention, the shield surface is divided into a first region (610*v*-1) and a second region (610*v*-2) in a direction perpendicular to the electrode surface.

It is still another object of the present invention to provide a probe structure suitable for a probe using a low-profile electrode, in which the shield comprises a two-dimensionally spread flat conductive member (650), and the member has an opening serving as the blank surface at substantially the center thereof, and a conductive region extending in a direction parallel to the electrode surface so as to surround the opening.

It is still another object of the present invention to provide a board inspection method of applying an AC signal to the end portion of a pattern line serving as an inspection target or detecting an inspection signal at the end portion of the pattern line, and at the same time grounding the end portion of a pattern line except the target pattern line.

According to an aspect of the inspection method of the present invention, the end portion of the target pattern line is sequentially switched.

According to an aspect of the inspection apparatus of the present invention, the inspection apparatus further comprises means for moving a probe in an arbitrary direction.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

Two probes to which the present invention is applied, and one inspection apparatus using these probes will be described with reference to the accompanying drawings.

<Probe Assembly> . . . First Embodiment

Figure 1:
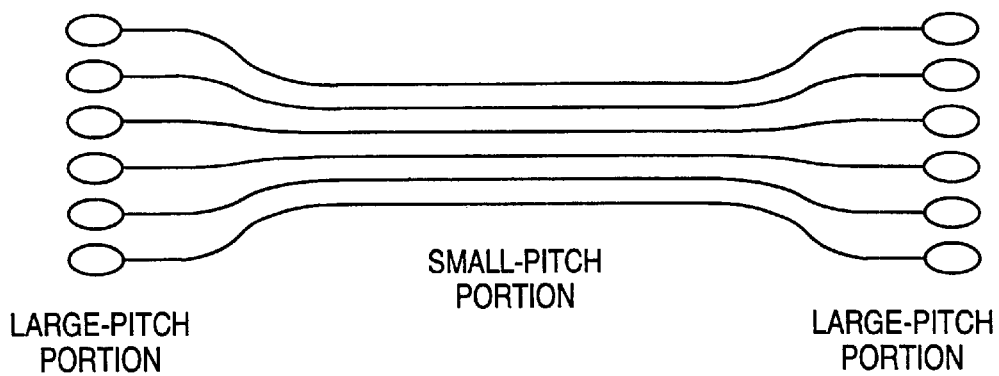
FIG. 1 is a view showing pattern lines terminating with large pitches at its two terminals.
Figure 2:
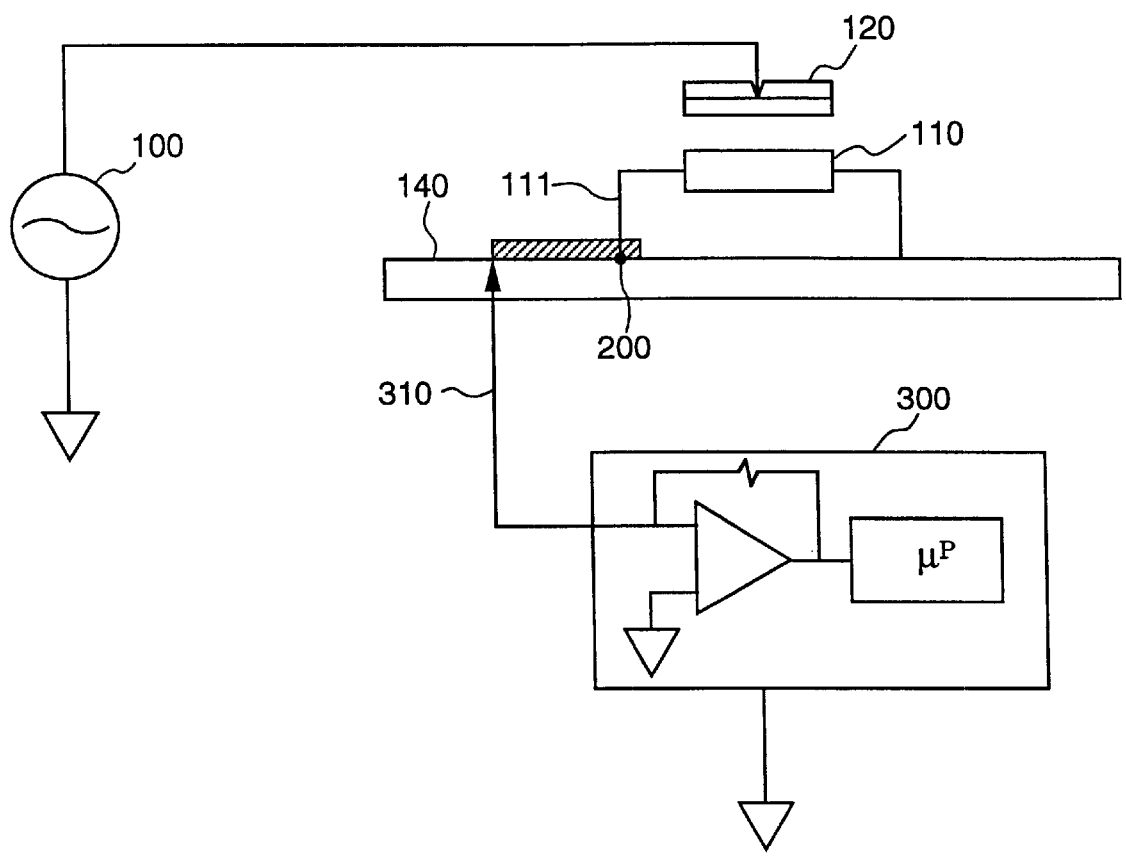
FIG. 2 is a diagram showing the arrangement of a board inspection apparatus system using a conventional probe.
Figure 3:
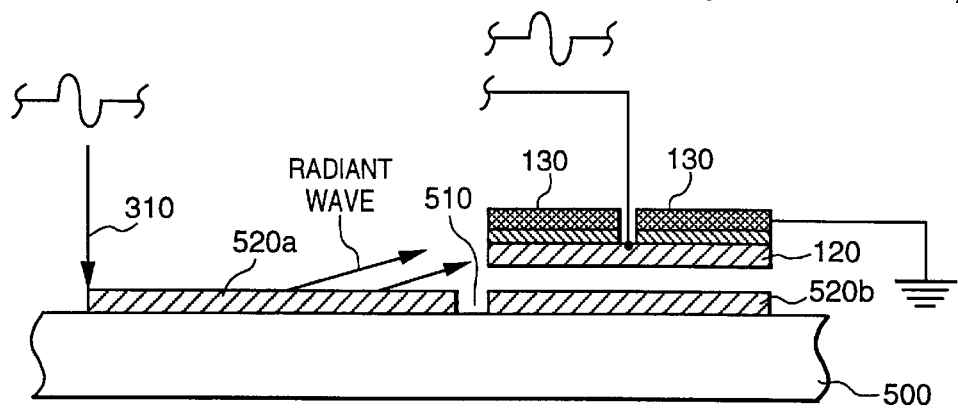
FIG. 3 is a view for explaining a state in which a probe used in the inspection system in FIG. 2 picks up unwanted radiant waves.
Figure 4:
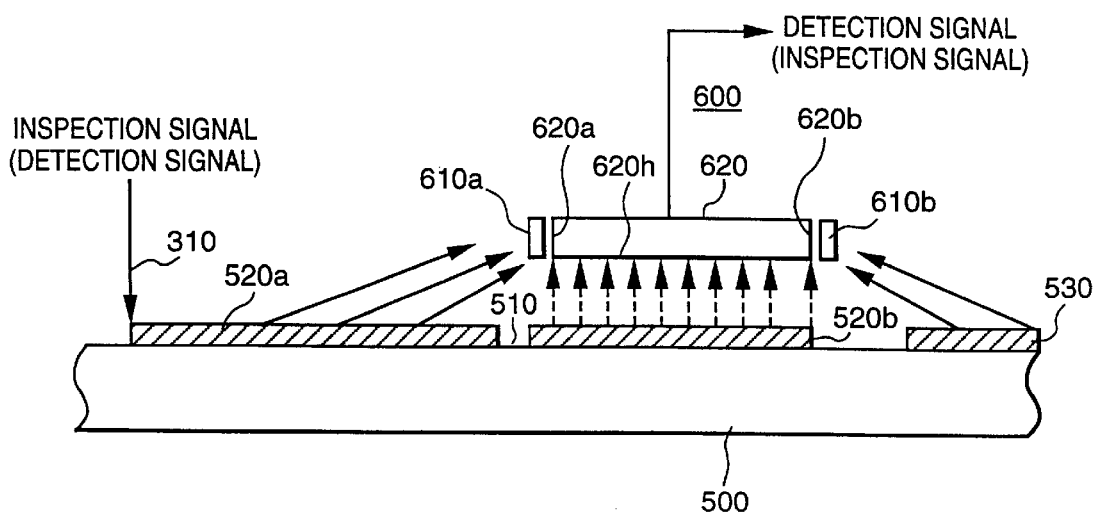
FIG. 4 is a view showing the arrangement of a probe assembly according to the first embodiment of the present invention.

FIG. 4 is a view for explaining the principle of the arrangement of a probe assembly 600 according to the first embodiment to which the present invention is applied.

The probe assembly 600 includes an electrode 620 and a shield 610. Reference numeral 500 denotes a board serving as an inspection target.

Pattern lines 520 and 530 are formed on the board 500. A disconnection 510 is present in the pattern line 520. The pattern line 520 is separated into pattern line portions 520a and 520b due to the presence of this disconnection. FIG. 4 shows a state in which the probe assembly 600 according to the first embodiment is positioned above the pattern line portion 520b by a positioning device (not shown). An electrode 310 is connected to one end of the pattern line portion 520a.

When an AC inspection signal is applied to the electrode 310, an electric field or electro-magnetic field is formed along the pattern line 520. In other words, weak radiant waves are generated from all portions of the pattern line 520 and they are apt to reach the electrode 620. Since the disconnection 510 is present on the board 500, the pattern line portion 520b generates no radiant waves, but the pattern line portion 520a generates radiant waves. If the pattern line 530 is capacitively coupled to or in ohmic contact with the pattern line 520, the pattern line 530 also generates radiant waves.

Since the pattern line 520 serving as the inspection target has the disconnection 510, the electrode 620 should not receive any radiant wave. The shield 610 prevents unwanted radiant waves (radiant waves from the pattern line portion 520a and the pattern line 530 in FIG. 4) from reaching the electrode 620. The pattern line portion 520b generates no radiant waves, and the electrode 620 receives no radiant waves. Therefore, the amplitude of the detection signal is zero or has a very low level.

If no disconnection 510 is present, the radiant waves from the pattern line portion 520b are received by the electrode 620 while the radiant waves from the pattern line portion 520b are shielded. When the electrode 620 is connected to an amplifier (not shown), an amplified signal can be monitored to determine the presence/absence of a disconnection.

The shield 510 must cover the electrode 620 so that the electrode 620 may not receive any unwanted radiant waves. In FIG. 4, shields 610a and 610b cover vertical surfaces 620a and 620b of the flat electrode 620 so that these vertical surfaces 620a and 620b to detect radiant waves from the pattern line portion 520a and the pattern line 530.

Pattern lines (pitch: several decade $\mu$m) are formed at a very high density on a board to be inspected by this inspection probe assembly. The amplitude of a signal to be applied to the electrode 310 is small, and its frequency is also low (about 10 kHz). For this reason, to detect a signal having a large amplitude by the probe, the probe assembly 600 must come very close to the board surface.

When the probe assembly 600 comes very close to the board, radiant waves from the pattern line portion 520a and the pattern line 530 will not round about to be received by a horizontal surface 620h of the electrode 620.

When the probe assembly 600 need not come very close to the board (e.g., when pattern lines have a large pitch, or the frequency or voltage of an inspection signal is high), the horizontal surface 620h of the electrode of the probe assembly 600 is separated from the substrate surface. Therefore, the horizontal surface 620h of the electrode 620 may receive the radiant waves from the pattern line portion 520a and the pattern line 530. In this case, the shields 610a and 610b must be further extended downward.

The shield 610 need not entirely cover the vertical surfaces of the electrode 620 because a vertical surface in a given direction may not have any pattern line portion in this direction. As the layout of pattern lines on a board serving as an inspection target is known, a vertical surface in an unnecessary direction need not be formed on the shield 610. That is, the shield preferably has directivity, as needed.

Figure 5:
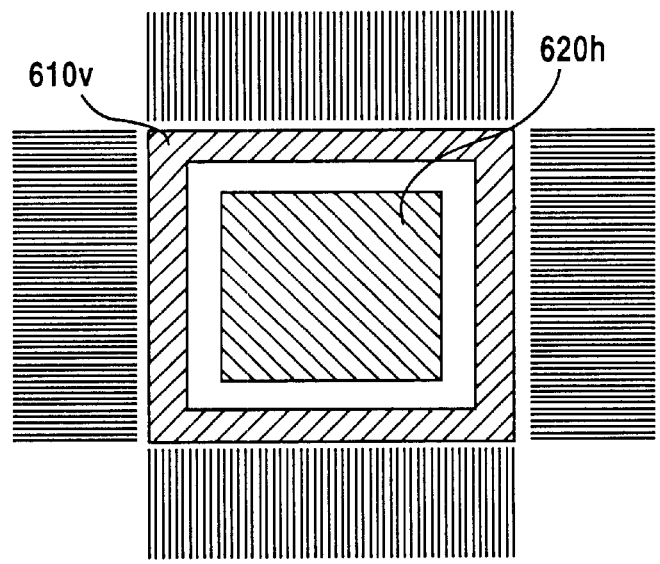
FIG. 5 is a plan view showing the arrangement of a probe assembly suitable for inspecting a board on which pattern lines extend in four directions, the probe assembly being an example of the probe assembly of the first embodiment (FIG. 4)
Figure 6:
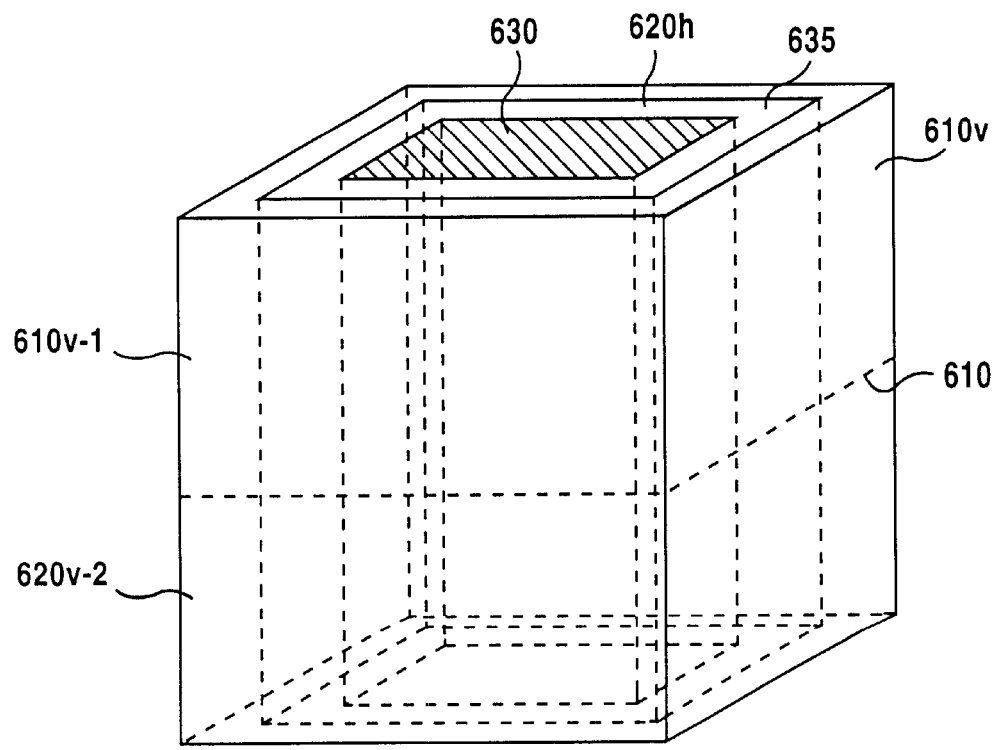
FIG. 6 is a perspective view showing the arrangement of a probe assembly in which a shield is divided into upper and lower regions, the probe assembly being as another example of the probe assembly of the first embodiment (FIG. 4)

FIG. 5 is a plan view of an example of the probe assembly 600 for inspecting a board having pattern lines extending in four directions when viewed from the top. In this example, vertical surfaces 610v of a shield are formed to surround the horizontal surface 620h of the electrode 630. FIG. 6 is a perspective view of the probe assembly 600 in FIG. 5.

A central metal conductor 630 forms an electrode. The effective surface of this electrode is formed on the lower surface of the metal conductor 630. Reference numeral 635 in FIG. 6 denotes an insulating layer for insulating the vertical surfaces 610v of the shield from the metal conductor 630 serving as an electrode. The shield having the vertical walls 610v is made of conductive metal. In the example shown in FIG. 6, the shield covers the vertical wall surfaces of the metal conductor 630 with inner surfaces. The shield is divided by a boundary 610v into an upper region made of a metal net and a lower region made of a copper plate. The upper region shields the electrode from radiant sources (e.g., power supply lines of the inspection apparatus and probing wiring lines) of various waves outside the board.

The size of the electrode surface of the probe assembly is determined in accordance with the size of parts to be mounted on the bare boards serving as a measurement target, i.e., the degree of spread at the end portions of pattern lines on the board. For example, the sizes of parts generally range from several mm to several cm, and the sizes of electrode portions range from several mm to several cm, accordingly.

<Probe Assembly> . . . Second Embodiment

Figure 7:
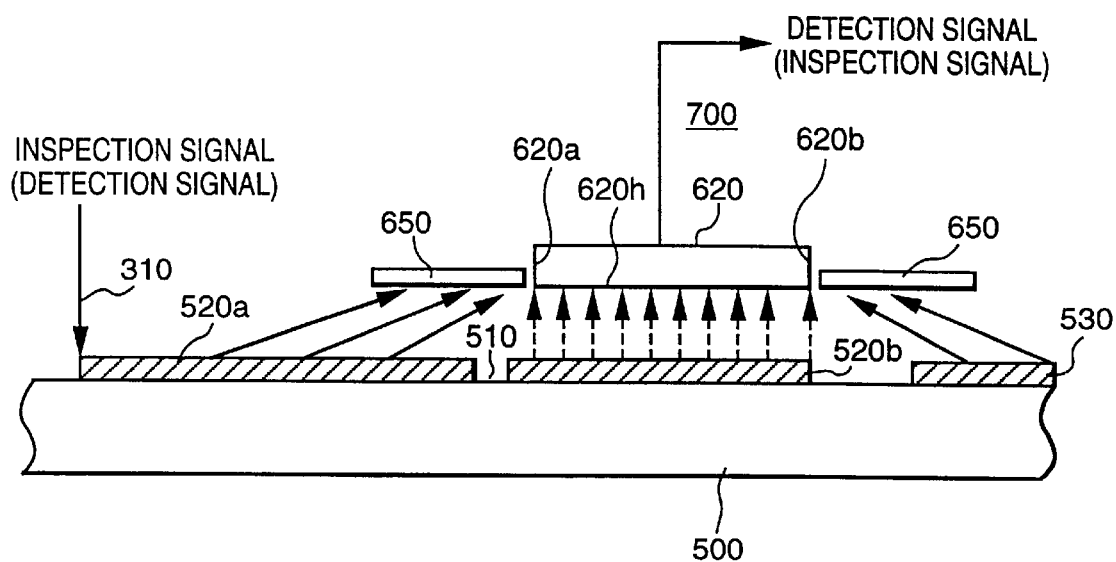
FIG. 7 is a view for explaining the arrangement of a probe assembly according to the second embodiment of the present invention.

FIG. 7 shows the structure of a probe assembly 700 according to the second embodiment. An electrode 620 itself of the probe assembly of the second embodiment is identical to the electrode 620 of the probe assembly of the first embodiment. The probe assembly 700 is different from the probe assembly of the first embodiment in the shield structure.

Since the electrode 620 receives radiant waves, the height of the electrode need not be large. The length of a vertical surface 620v in the direction of height can be small. The vertical surface 620v may receive unnecessary radiant waves although the vertical surface 620 is low (its length is small). For this reason, the probe assembly 700 of the second embodiment has a flat shield 650 extending in the horizontal direction.

Figure 8:
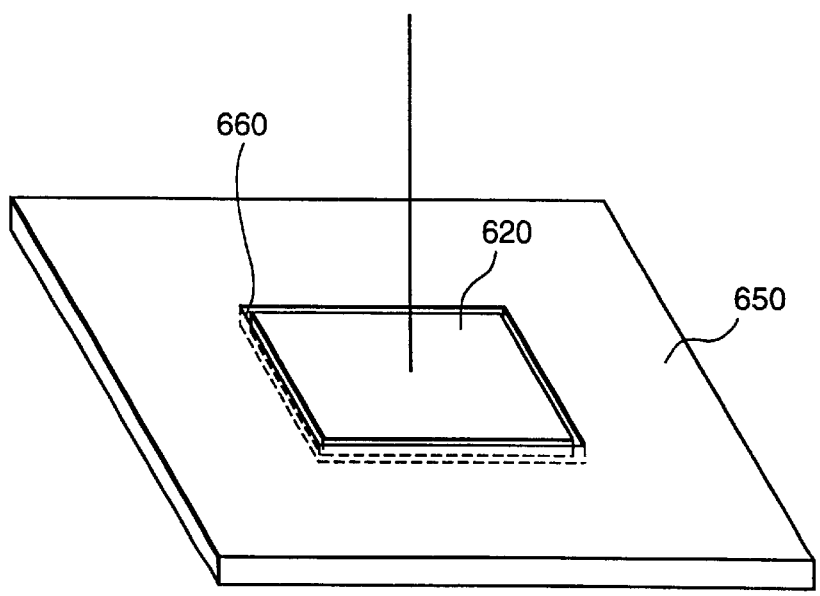
FIG. 8 is a perspective view showing an example of the probe assembly of the second embodiment (FIG. 7)

FIG. 8 is a perspective view of the shield 650. An opening is formed at the center of the shield 650. The electrode 630 is stored in the opening of the shield 650. A gap 660 is formed between the electrode 620 and the shield 650 and is preferably filled with an insulating material. The material connects and fixes the electrode 620 to the shield 650. The shield 650 moves together with the electrode 620 upon movement of the electrode 620.

<Inspection Apparatus System> . . . First Embodiment

Figure 9:
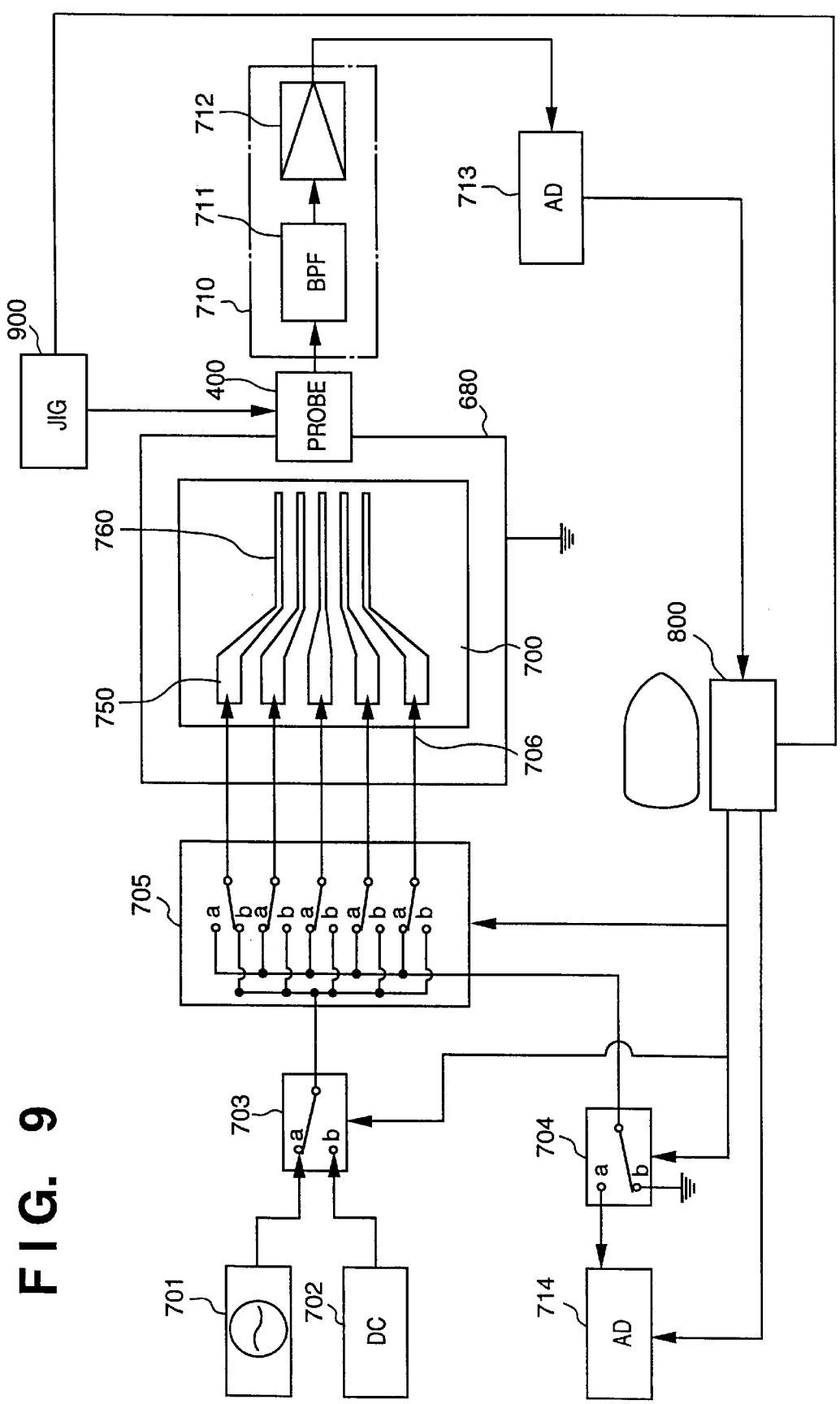
FIG. 9 is a block diagram showing the arrangement of a board inspection apparatus (first embodiment) using a probe assembly of the present invention.

FIG. 9 is a block diagram showing the arrangement of a board inspection apparatus system to which a probe assembly of the present invention is applied. Each of the probe assemblies of the above two embodiments is applicable to the system shown in FIG. 9.

This inspection system is suitable for an inspection of a board having a larger number of pattern lines such that the terminals (the electrode 310 in FIG. 4) of the pattern lines as an inspection target on one side have a relatively large pitch, and the terminals of the pattern lines on the side of mounted parts such as IC packages have a very small pitch.

Referring to FIG. 9, reference numeral 600 denotes the probe assembly of the first or second embodiment. This probe assembly 600 is connected to a jig plate 900 which is capable of accommodating a plurality of probe assemblies. A personal computer 800 controls the jig plate 900 to move downward to fit the probe assemblies 600 closer to a board 700, and to move upward to separate from the board 700 when a measurement test is terminated.

A pattern line group constituted by a large-pitch pattern line portion 750 and a small-pitch pattern line portion 760 is formed on the board 700 as an inspection target. The board 700 is entirely grounded by a ground plate 680 disposed under the board 700.

The terminals of the large-pitch pattern line portion 750 are connected to the probes of a probe group 706, respectively. The lead wires from the probe group 706 are connected to a switch box 705.

Referring to FIG. 9, reference numeral 701 denotes an oscillator for generating a DC inspection signal; 702, a DC power supply for generating a DC signal; and 703, a power supply relay for switching between the AC signal from the oscillator 701 and the DC signal from the power supply 702. A switch 704 is a two-contact switch, one contact (contact b) of which is grounded.

The switch box 705 has switch elements whose number is larger than or equal to that of the contact probes of the contact group 706. Each switch element has two contacts. When each switch element is connected to the a side, the signal from the relay 703 is supplied to the corresponding contact probe of the probe group 706. When each switch element is connected to the b side, the potential from the switch 704 is supplied to the corresponding contact probe of the probe group 706.

The signal detected by the probe assembly 600 is supplied to a waveform processor 710 and subjected to filtering in a filter (BPF) 711. The output from the filter 711 is amplified by an amplifier 712. The amplified signal is converted into a digital signal by an A/D converter 713. The digital signal is fetched into the personal computer 800.

Note that the conductive pattern of the illustrated inspection target board 700 has 5-channel conductive paths for illustrative convenience. However, the number of channels is not limited to a specific one.

Short-Circuiting Test

A short-circuiting inspection for the conductive patterns of the pattern line portion 760 will be described first.

The personal computer 800 controls the relay 703, the switch 705, and the switch box 705 as follows.

That is, the switch 704 is connected to the a side, i.e., the output from the switch 704 is connected to the A/D converter.

Of the plurality of switch elements of the switch box 705, only the switch elements connected to the probes of the probe group 706 connected to the pattern lines serving as the inspection targets are connected to the terminal b sides, and the remaining switches in the switch box 705 are connected to the terminal a sides.

At the same time, the personal computer 800 controls to connect the relay 703 to the terminal b side. A DC voltage is applied from the DC power supply 702 to the inspection target pattern lines.

If short-circuiting has occurred in an arbitrary pattern line on the board 700, the DC voltage applied to the inspection target pattern line (i.e., a pattern line connected to the uppermost probe in FIG. 9) is returned through the short-circuited pattern line and input to an A/D converter 714 through the contact a side of the switch 704. If no short-circuiting is present, the potential detected on the terminal a side of the switch 704 must be low. The personal computer 800 monitors the output signal from the A/D converter 714 to determine whether short-circuiting has occurred in the inspection target pattern lines.

Note that the target pattern lines in the short-circuiting test can be switched by switching the switches in the switch box 705.

Disconnection Test

A disconnection inspection for a conductive pattern will be described below.

To perform a disconnection test, the relay 703, the switch 704, and the switch box 705 will be controlled as follows. More specifically, the switch 704 is connected to the terminal b side and grounded. Of the plurality of switch elements in the switch box 705, only the switch elements connected to the probes of the probe group 706 connected to the inspection target pattern lines are connected to the b sides, and the remaining switches in the switch box 705 are connected to the a sides. At the same time, the personal computer 800 controls to connect the relay 703 to the terminal a side. Therefore, an AC signal is applied from the oscillator 701 to the inspection target pattern lines.

Pattern lines except the inspection target pattern lines are grounded to suppress generation of unnecessary radiant waves from the pattern lines except the inspection target pattern lines.

The AC signal applied to the inspection target pattern lines is received as radiant waves by the electrode of the probe assembly 600. The received radiant waves are filtered by the BPF 711 as an electrical signal. The electrical signal is amplified and converted into a digital signal.

The personal computer 800 compares the input signal from the A/D converter 713 with a predetermined threshold value to determine whether a disconnection is present. More specifically, if a disconnection is present in one of the inspection target pattern lines, the voltage level of the signal from the A/D converter 713 is much lower than the reference level. Therefore, the presence/absence of a disconnection can be discriminated in accordance with this level difference.

<Inspection Apparatus> . . . Second Embodiment

The inspection apparatus of the first embodiment applies an AC inspection signal to the terminals of the large-pitch pattern line portion. An inspection system of the second embodiment applies an AC inspection signal from the electrode of a probe assembly 600 to a small-pitch pattern line portion.

The constituent elements of the inspection apparatus of the first embodiment can be applied to the inspection apparatus of the second embodiment. The same reference numerals as in the first embodiment of FIG. 9 denote the same parts in FIG. 10.

Short-Circuiting Test

A short-circuiting inspection for conductive patterns of a pattern line portion 760 will be described first.

Figure 10:
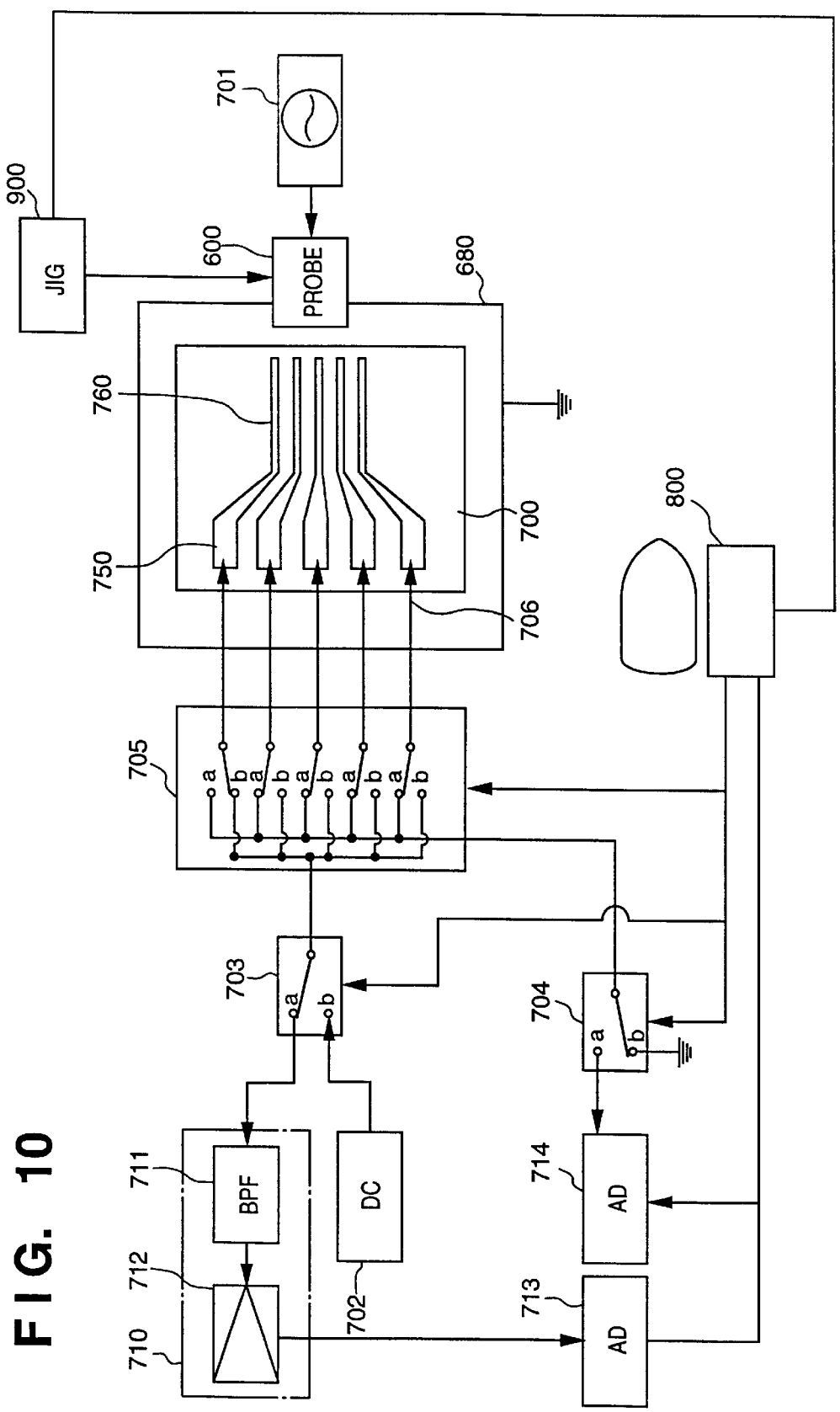
FIG. 10 is block diagram showing the arrangement of a board inspection apparatus (second embodiment) using a probe assembly of the present invention.

Referring to FIG. 10, a personal computer 800 controls a relay 703, a switch 704, and a switch box 705 as follows.

That is, the switch 704 is connected to the a side, i.e., the output from the switch 704 is connected to the A/D converter.

Of the plurality of switch elements of the switch box 705, only the switch elements connected to the probes of a probe group 706 connected to the pattern lines serving as the inspection targets are connected to the terminal b sides, and the remaining switches in the switch box 705 are connected to the terminal a sides. At the same time, the personal computer 800 controls to connect the relay 703 to the terminal b side. A DC voltage is applied from a DC power supply 702 to the inspection target pattern lines.

If short-circuiting has occurred in an arbitrary pattern line on a board 700, the DC voltage applied to the inspection target pattern line (i.e., a pattern line connected to the uppermost probe in FIG. 10) is returned through the short-circuited pattern line and input to an A/D converter 714 through the contact a side of the switch 704. If no short-circuiting is present, the potential detected on the terminal a side of the switch 704 must be low. The personal computer 800 monitors the output signal from the A/D converter 714 to determine whether short-circuiting has occurred in the inspection target pattern lines.

Note that the target pattern lines in the short-circuiting test can be switched by switching the switches in the switch box 705 as in the inspection apparatus of the first embodiment.

Disconnection Test

A disconnection inspection for a conductive pattern in the apparatus of the second embodiment will be described below.

To perform a disconnection test, the relay 703, the switch 704, and the switch box 705 will be controlled as follows with referring to FIG. 10. More specifically, the switch 704 is connected to the terminal b side and grounded. Of the plurality of switch elements in the switch box 705, only the switch elements connected to the probes of the probe group 706 connected to the inspection target pattern lines are connected to the b sides, and the remaining switches in the switch box 705 are connected to the a sides.

Pattern lines except the inspection target pattern lines are grounded to suppress generation of unnecessary radiant waves from the pattern lines except the inspection target pattern lines.

At the same time, the personal computer 800 controls to connect the relay 703 to the terminal a side, so that the relay 703 is connected to a BPF 711.

The personal computer 800 then drives an oscillator 701. The AC signal from the oscillator 701 is applied to the inspection target pattern lines through the probe assembly 600.

The radiant waves received by the inspection target pattern lines appear on the probe group 706 and filtered by the BPF 711 as an electrical signal. The electrical signal is amplified and converted into a digital signal.

The personal computer 800 compares the input signal from the A/D converter 713 with a predetermined threshold value to determine whether a disconnection is present. More specifically, if a disconnection is present in one of the inspection target pattern lines, the voltage level of the signal from the A/D converter 713 is much lower than the reference level. Therefore, the presence/absence of a disconnection can be discriminated in accordance with this level difference.

<Modifications>

Figure 11:
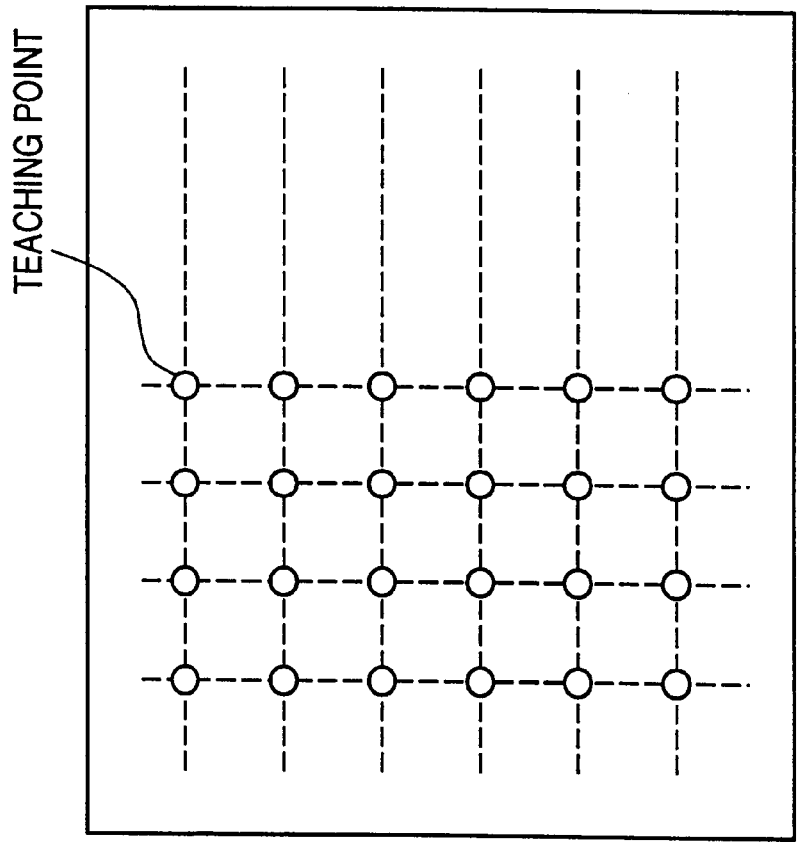
FIG. 11 illustrates how teaching points are arranged in an inspection system according to a modified embodiment in which one probe assembly is moved to the points.

Referring to FIG. 9, the jig plate 900 may be substituted by a positioning stage 900 capable of positioning the probe assembly 600 three-dimensionally (X, Y, and Z directions). The personal computer 800 controls the stage 900 to move the probe assembly 600 to an arbitrary position on a board 700. As shown in FIG. 11, the target moving positions (indicated by open circles in FIG. 11) are in advance by teaching, and teaching point data for each board are stored in a memory (not shown) in the personal computer 800.

θ axis is preferably added to the X, Y, and Z directions in a positioning stage 900 in order to adjust directivity.

<Advantages of Embodiments>

As has been described above, since a probe according to the present invention can shield radiant waves which are emitted from all sources located below the probe electrode and interfere with inspection, board inspection using this probe can be performed with a high accuracy.

As many apparently widely different embodiments of the present invention can be made without departing from the spirit and scope thereof, it is to be understood that the invention is not limited to the specific embodiments thereof except as defined in the appended claims.

What is claimed is:

1. A bare-board inspection method for inspecting a bare circuit board, prior to the circuit board being subjected to part mounting, the circuit board comprising a plurality of electrode terminals and a plurality of rows of conductive pattern lines, said plurality of rows of conductive pattern lines having a narrow width and narrow pitch, said method comprising:

providing a plurality of contact probes each contacting a respective one of said plurality of electrode terminals;

providing a sensor body having a sensing surface and a grounded shield;

bringing said sensing surface toward said plurality of rows of conductive pattern lines including a first row of said conductive pattern lines in non-contract manner;

contacting a first electrode terminal with a contact probe to feed an inspection signal to said first row of said conductive pattern lines connecting to the first electrode terminal, while contacting second electrode terminals other than the first electrode terminal with contact probes fed to ground to second rows of conductive pattern lines connected to the second electrode terminals, said inspection signal having an alternating current component; and evaluating a detected radiant wave to inspect the circuit board for a defect, wherein said sensing surface comprises a longitudinal length which covers said plurality of rows of conductive pattern lines in a direction of columns thereof, and said shield is arranged so that the shield prevents radiant waves radiated from any parts of said first row of said conductive pattern lines between said first electrode terminal and a portion of said first row of said conductive pattern lines that is beneath said shield, from being received by said sensing surface.

2. The method according to claim 1, further comprising the step of using as an inspection target a board on which pattern lines having a pitch of several decade µm are formed.

3. The method according to claim 1, further comprising the step of bringing said sensing surface close to the board while said sensing surface is electrically insulated from said board.

4. The method according to claim 1, wherein said sensing surface has an area substantially equal to that of a circuit part to be mounted on said bare board in a planar direction.

5. The method according to claim 1, further comprising the steps if sequentially switching over the plurality of electrode terminals.

6. The inspection method according to claim 1, wherein the sensing surface is substantially parallel to the bare circuit board.

7. The inspection method according to claim 1, wherein the grounded shed surrounds the sensing surface.

* * * * *